(12) United States Patent
Chen (10) Patent No.: US 7,741,697 B2
(45) Date of Patent: Jun. 22, 2010

(54) SEMICONDUCTOR DEVICE STRUCTURE FOR ANTI-FUSE

(75) Inventor: Yuan-Feng Chen, Hsinchu (TW)

(73) Assignee: Applied Intellectual Properties Co., Ltd., Taipei (TW)

( * ) Notice: Subject to any disclaimer, the term of this patent is extended or adjusted under 35 U.S.C. 154(b) by 344 days.

(21) Appl. No.: 11/785,370

(22) Filed: Apr. 17, 2007

(65) Prior Publication Data

US 2008/0258217 A1    Oct. 23, 2008

(51) Int. Cl.
  *H01L 29/00* (2006.01)
  *H01L 29/04* (2006.01)
(52) U.S. Cl. .......................... 257/530; 257/50
(58) Field of Classification Search ............... 257/50, 257/209, 530, E23.147
  See application file for complete search history.

(56) References Cited

U.S. PATENT DOCUMENTS 6,936,909 B2 *   8/2005   Marr et al. ................. 257/530
2005/0184315 A1 *   8/2005   Okayama ..................... 257/209
2006/0046354 A1 *   3/2006   Kreipl ........................ 438/132

* cited by examiner

*Primary Examiner*—Hung Vu
(74) *Attorney, Agent, or Firm*—Muncy, Geissler, Olds & Lowe, PLLC (57) ABSTRACT

The present invention discloses a semiconductor device, the device comprising a semiconductor layer on a substrate. A gate oxide and a gate electrode are formed on the semiconductor substrate. A gate conductive layer is formed on the gate electrode. A first doped region is formed in the semiconductor layer. A dielectric spacer is optionally formed onto the sidewall of the gate electrode and part of the semiconductor layer. A second doped region is formed from a predetermined distance to the gate electrode, wherein the predetermined distance is no less than the distance between the first doped region and the gate electrode. A third doped region is formed adjacent to the first doped region in the semiconductor layer and between the first doped region and the second doped region.

31 Claims, 6 Drawing Sheets

Gate oxide breakdown

$C_{OFR} \ll C_{OV} + C_{FR}$ of FIG.3

FIG. 4 (Present Invention)

SEMICONDUCTOR DEVICE STRUCTURE FOR ANTI-FUSE

BACKGROUND OF THE INVENTION

1. Field of the Invention

The present invention relates to a semiconductor device, and more specifically, to a device structure.

2. Description of the Related Art

The semiconductor industry has been advanced to the field of Ultra Large Scale Integrated Circuit (ULSI) technologies. The fabrication of the nonvolatile memories also follows the trend of the reduction in the size of a device. The nonvolatile memories include various types of devices. Different types of devices have been developed for specific applications' requirements in each of these segments. The formation of nonvolatile memories toward the trends of low supply power and fast access, because these requirements are necessary for the application of the mobile computing system.

Figure 1:
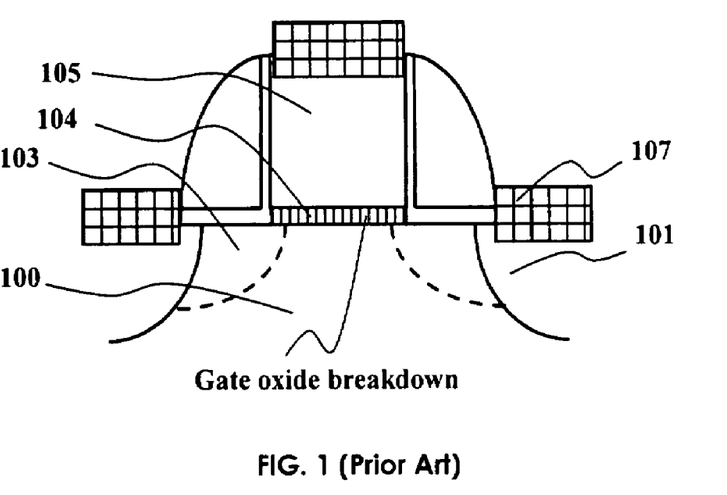
FIG. 1 is a cross sectional view of a semiconductor device illustrating the first example of prior arts.

One of the semiconductor devices is called anti-fuse as shown in FIG. 1. The MOS transistor consists of a silicon substrate 100, a gate dielectric 104, a doped polysilicon gate 105, lightly doped regions 103, and source/drain regions 101 formed by diffusion of N-type dopants in the silicon substrate. Silicide 107 is introduced on the exposed surface of the top portion of the gate 105 and the source and drain regions 101. The gate dielectric 104 separating the polysilicon gate 105 from the channel region usually consists of the thermally grown silicon dioxide. When the gate dielectric is stressed beyond a critical electrical field, the transistor is destroyed by rupturing of the gate dielectric. Rupturing dielectric requires sufficient pulse width duration and amplitude to provide enough damaging power through the gate oxide, which therefore produces a reliable, low resistance anti-fuse.

The anti-fuse layer is initially intact, but it can be ruptured or broken by applying a sufficient voltage across the memory cell. The voltage is chosen such that the anti-fuse layer ruptures, and a high conductivity state of the memory cell is established.

In reading operation, a ground voltage is applied to the transistor's body or well via metal interconnect, and a read voltage is applied to the gate. In this situation, the gate oxide between well and gate is stressed in a low electric field, thereby allowing no current to flow between the well and the gate. Since no reading current is detected, the digital state is defined as "0". To program anti-fuse, the gate voltage is increased until avalanche breakdown occurs at the gate oxide. When avalanche breakdown occurs, a breakdown current will flow through the oxide. This current flow causes permanent damages in the oxide structure along the path of the breakdown current. When the gate is applied with a read voltage, there is a significant leakage current to flow between the well and the gate. As a result, the digital state is defined as "1" by this reading current.

Figure 2:
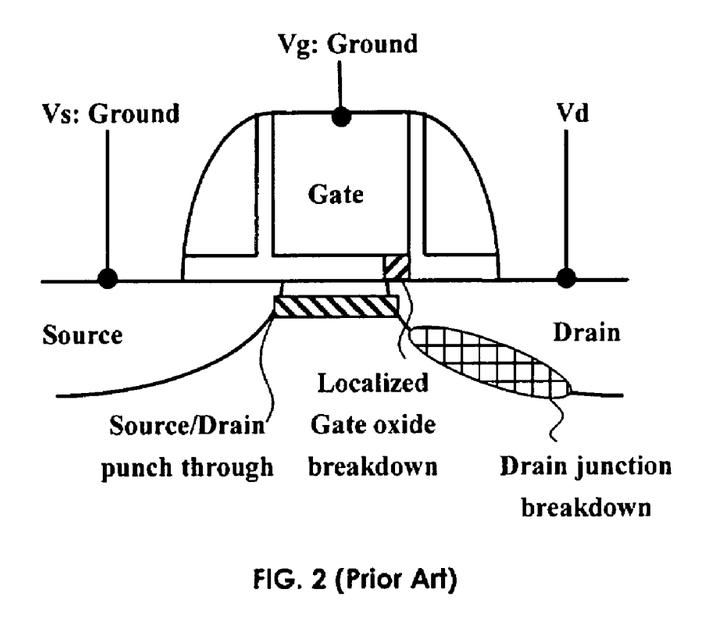
FIG. 2 is a cross sectional view of a semiconductor device illustrating three major programming mechanisms in the prior arts.

FIG. 2 illustrates other alternative programming mechanisms including "Localized gate oxide breakdown", "Drain junction breakdown" and "Source/Drain punch through" used for Anti-Fuse applications. However, all these three mechanisms are required a high drain voltage, Vd, for programming while the Vg, Vs and body are grounded. As Vd is increased and applied to the drain, one of the three programming mechanisms will take place first. The first mechanism is determined by the operating and device parameters, such as applied signal timing, signal amplitude, gate oxide thickness, channel length, doping concentration, fringing capacitance and so forth. By leaving Vg as floating, the localized gate oxide breakdown can be avoided for the high Vd potential. However, the high Vd induces a moderate potential in Vg which therefore has the risk to turns on the channel.

Figure 3:
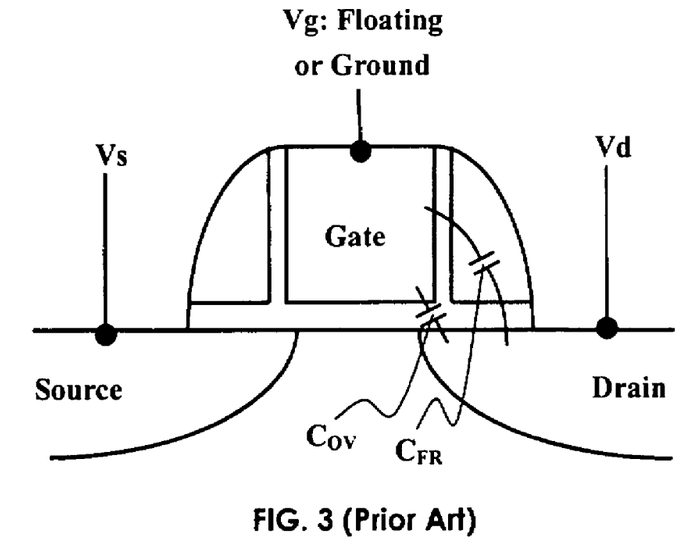
FIG. 3 is a cross sectional view of a semiconductor device illustrating the coupling capacitance according to the prior arts.

FIG. 3 illustrates the overlapped and fringing capacitors, i.e. $C_{OV}$ and $C_{FR}$, near the drain side. The total coupling capacitance includes $C_{OV}$ and $C_{FR}$. The Vg can be induced to a moderate voltage between ground and Vd depending on its gate coupling efficiency. Once Vg approaches the transistor's threshold voltage, the channel has been lightly turned on and allows high current during its programming stage. Therefore, the anti-fuse devices in the prior art have found high power consumption and gate oxide degradation problems due to their high coupling capacitance. An anti-fuse device having low coupling capacitance is needed to prevent localized gate oxide breakdown and channel turned-on for low power and high density applications.

Those devices are manufactured by various processes and the device operating scheme is different from each other. The present invention provides a basic device structure for those devices including, but not limited to, non-volatile, anti-fuse, mask-ROM.

SUMMARY OF THE INVENTION

The object of the present invention is to disclose a device structure with low fringing coupling capacitance to prevent localized gate oxide breakdown and channel turned-on that could be used for forming an anti-fuse. The structure could be employed to play the role of various functions by altering the programming bias coupled thereto or by changing the read scheme in the basic structure provided by the present invention.

The device of the present invention comprises a semiconductor layer on a substrate. The substrate can be a SOI substrate or strained substrate. A gate oxide and a gate electrode are formed on the semiconductor substrate. A gate conductive layer is formed on the gate electrode. A first doped region is formed in the semiconductor substrate or layer. A dielectric spacer is optionally formed onto the sidewall of the gate electrode and part of the semiconductor substrate. A second doped region is formed from a predetermined distance to the gate electrode, wherein the predetermined distance is no less than the distance between the first doped region and gate electrode. A metal-semiconductor compound is formed on at least one of the gate electrode and the first and second doped regions. A conductive plug is formed onto the metal-semiconductor compound. An isolation layer is formed between the gate electrode and the conductive plug. A resistance is formed between the first and second doped regions wherein the resistance can be alternated by a predetermined electric signal.

The device of the present invention further comprises a channel located under the gate electrode wherein the length of the channel is longer than the length of the gate electrode; a third doped region is formed adjacent to the first doped region in the semiconductor substrate and between the first doped region and the second doped region.

The device may further comprises pocket doped region formed adjacent to at least one of the first and third doped region, wherein the conductive type of the first and second doped regions are opposite to the conductive type of the pocket doped region, wherein the junction between the third doped region and semiconductor substrate is formed under the gate electrode, wherein the junction depth of the third doped region is shallower than the junction depth of the first doped region and the conductive type of the first and third doped regions are the same.

The device further comprises a fourth doped region formed adjacent to said second doped region, wherein the junction depth of said fourth doped region is deeper than the junction depth of said second doped region and the conductive types of said second and fourth doped regions are the same.

The metal-semiconductor compound includes $TiSi_2$, $CoSi_2$ or NiSi. The semiconductor substrate comprises silicon germanium compounds, strained silicon, polycrystalline silicon, single crystal silicon and combinations thereof.

The surface of the semiconductor layer may be non-planar and the substrate comprises semiconductor-on-insulator (SOI). The conductive plug includes Al, W, polycrystalline silicon, silicide, Cu, Ta, metal-nitride compound or combinations thereto. The isolation layer includes $SiO_2$, silicon nitride, oxynitride, dielectric materials with dielectric constant less than 3.5 or combinations thereof. The dielectric spacers include oxide, nitride, oxide-nitride bi-layer, oxide-nitride-oxide multi-layer or the combination of the above materials. The dielectric spacers comprise oxide-nitride or oxide-nitride-oxide structure.

The device further comprises at least one transistor connected to the first or second doped region for circuit switching, voltage pulling-up or voltage pulling-down. The voltage pull-up or pull-down transistor is a metal-oxide-semiconductor field effect transistor (MOSFET).

Alternatively, the aforementioned structure could be applied to various devices by changing the bias of the nodes including gate, source and drain. For instance, a voltage or current supply circuit which provides voltage difference between the first and second doped regions may be connected to the source and drain regions, the voltage or current supply circuit is performed to alternate the conductivity between the first and second doped region as digital state "1" or digital state "0", wherein the semiconductor layer is optionally grounded. In other words, the device comprises a circuit providing same potential to the gate electrode and the semiconductor substrate. Therefore, the structure may perform an anti-fuse function.

The present invention may transfer the basic device structure into various devices by adjusting the nodes bias or slightly changing the doped scheme or spaces structure of the basic device structure.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENTS

The present invention proposes a novel anti-fuse structure with low coupling capacitance to prevent localized gate oxide breakdown and channel turned-on. The detail description will be seen as follows. A semiconductor substrate having semiconductor layer formed there on is provided for the present invention. In a preferred embodiment, the substrate comprises semiconductor-on-insulator (SOI) scheme. In one embodiment, the semiconductor layer comprises silicon germanium compounds, strained silicon and combinations of the above materials. In addition, the semiconductor layer may be non-planar.

The present anti-fuse comprises a semiconductor substrate (it may have semiconductor layer formed thereon). A gate electrode is formed on the semiconductor substrate. A gate conductive layer is formed on the gate electrode. A first doped region is formed in the semiconductor layer. A dielectric spacer is optionally formed onto the sidewall of the gate electrode and part of the semiconductor layer. A second doped region is formed from a predetermined distance to the gate electrode wherein the predetermined distance is no less than the distance between first doped region and the gate electrode. A third doped region is formed adjacent to the first doped region in the semiconductor layer and closer to the gate electrode than the first doped region. A voltage difference is provided between the first and second doped regions to alter resistance there between to indicate a digital state. In the anti-fuse structure, the present invention further comprises a low coupling capacitance between the gate electrode and second doped region because the length of said channel is longer than the length of the gate electrode.

Figure 4:
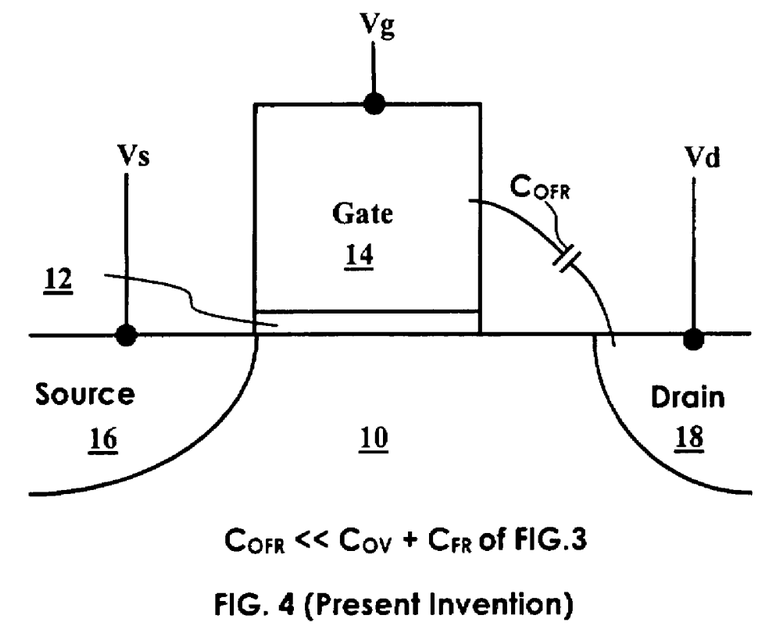
FIG. 4 is a cross sectional view of a semiconductor device illustrating the first embodiment according to the present invention.

In order to achieve the above structure, one of the processes is shown in the FIG. 4, a single crystal silicon substrate 10 with a <100> or <111> crystallographic orientation is provided. The semiconductor layer includes a pattern of active areas. The isolation to separate the devices includes STI (Shallow Trench Isolation) or FOX (field oxide). A thin dielectric layer 12 consisted of silicon dioxide is formed on the substrate 10 to act as gate electrode dielectric. Typically, the dielectric layer 12 can be grown in oxygen ambient at a temperature of about 700 to 1100 degrees centigrade. Other method, such as chemical vapor deposition, can also form the oxide. In the embodiment, the thickness of the silicon dioxide layer 12 is approximately 15-250 angstroms. Subsequently, a gate conductive layer 14 is formed on the dielectric layer 12. The conductive layer 14 may be formed of doped polysilicon, in-situ doped polysilicon or epitaxy silicon. For an embodiment, the doped polysilicon layer 14 is doped by phosphorus using a $PH_3$ source. A photo-resist defined patterning process is used on the conductive layer 14, thereby forming the gate structure on the silicon substrate 10.

FIG. 4 illustrates the first embodiment of the present invention, wherein the source region 16 and drain region 18 are formed by performing an ion implantation to dope ions into the substrate 10 using the gate structure as a mask by using well know manner. The drain region 18 is formed from a predetermined distance to the gate electrode 14. It is noted that the predetermined distance is no less than the distance between source region 16 and gate electrode 14. That is the length of a channel is longer than that of the gate electrode. Such structure causes a relatively low coupling capacitance $C_{OFR}$ than that of $C_{OV}$ plus $C_{FR}$ of FIG. 3. Therefore, it results in a faster programming speed than the prior arts.

In FIG. 4, similarly, the Vg can be induced to a moderate voltage between ground and Vd depending on its gate coupling efficiency. Once Vg approaches the transistor's threshold voltage, the channel has been lightly turned on and allows high current during its programming stage. Therefore, the anti-fuse devices in the present invention have found low power consumption due to their low coupling capacitance. An anti-fuse device having low coupling capacitance of the present invention can prevent localized gate oxide breakdown and channel turned-on for low power and high density applications of the prior arts.

Figure 5:
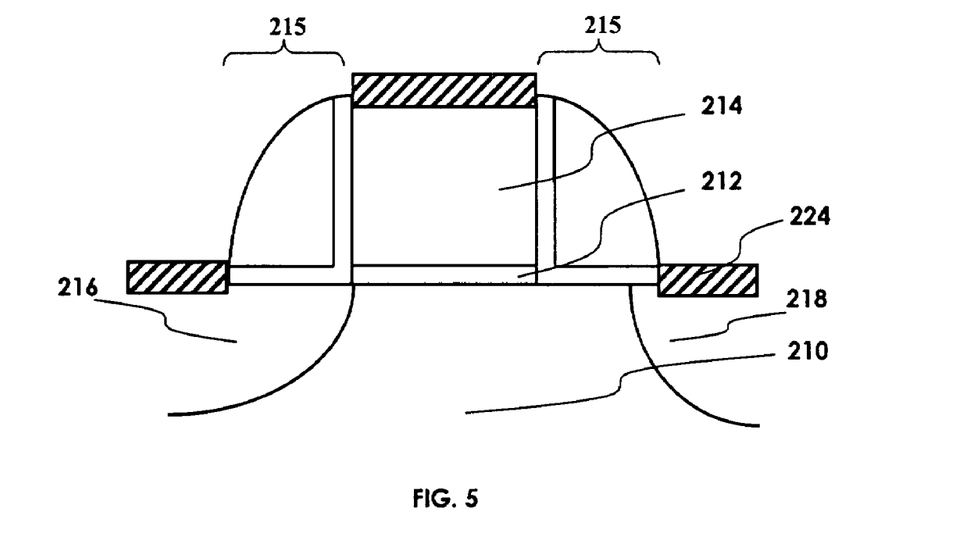
FIG. 5 is a cross sectional view of a semiconductor device illustrating the second embodiment according to the present invention.

Referring to FIG. 5, it illustrates the second embodiment of the present invention. Similarly with the FIG. 4, the source region 216 and drain region 218 are formed by performing an ion implantation to dope ions into the substrate 210 using the gate structure including a dielectric layer 212 and a gate conductive layer 214 as a mask. In the present embodiment, silicide or metal-semiconductor compound 224 is introduced on the exposed surface of the top portion of the gate conductive layer 214 and the source and drain regions 216, 218 to reduce their resistance. Preferably, the metal-semiconductor compound 224 can be $TiSi_2$, $WSi_2$, $CoSi_2$ or NiSi. Moreover, a sidewall spacer 215 is optionally formed on the gate structure and the source and drain regions 216, 218. Typically, the sidewall spacer 215 includes oxide, nitride, oxynitride, oxide-nitride bi-layer (ON), oxide-nitride-oxide multi-layer (ONO) or the combination thereof.

Between of the doped source region 216 and the doped drain region 218, wherein the predetermined distance from drain 218 to gate electrode is no less than the distance from source 216 to the gate electrode. Of course, the length of a channel is longer than that of the gate electrode due to the predetermined distance. In other words, a first portion of channel region is under gate electrode 214, and a second portion of channel region is under the spacer 215. Such structure still causes a relatively low coupling capacitance than prior arts. Accordingly, it creates a faster programming speed than the prior arts.

Figure 6:
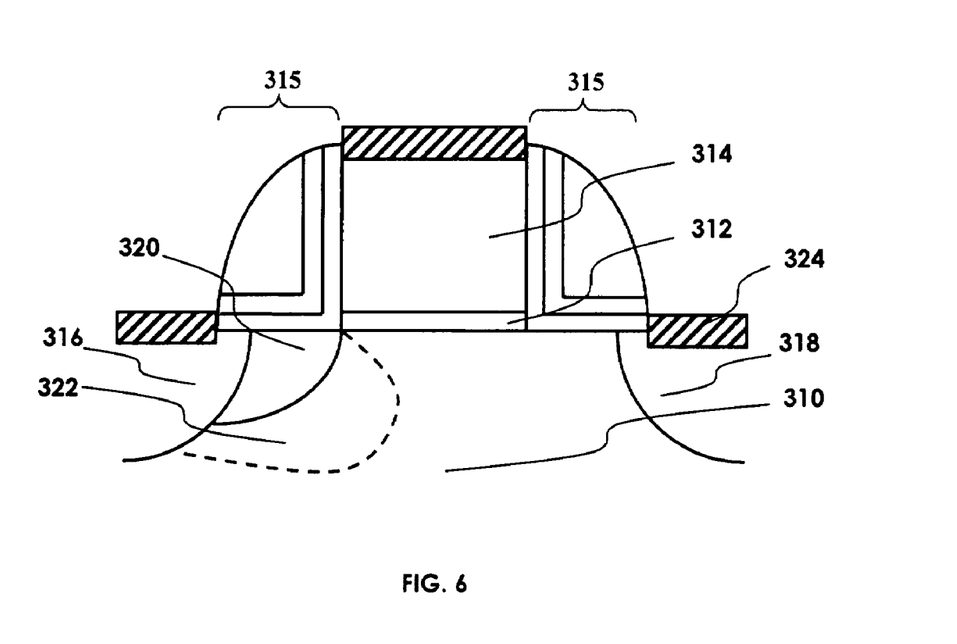
FIG. 6 is a cross sectional view of a semiconductor device illustrating the third embodiment according to the present invention.

FIG. 6 illustrates the third embodiment of the present invention. The source region 316 and drain region 318 are formed by performing an ion implantation into the substrate 310 using the gate structure including a dielectric layer 312 and a gate conductive layer 314 as a mask. In the present embodiment, silicide or metal-semiconductor compound 324 is introduced on the exposed surface of the top portion of the gate conductive layer 314 and the source and drain regions 316, 318 to reduce their resistance. Preferably, the metal-semiconductor compound 324 can be $TiSi_2$, $WSi_2$, $CoSi_2$ or NiSi. Moreover, a sidewall spacer 315 is optionally formed on the gate structure and the source and drain regions 316, 318. Typically, the sidewall spacer 315 includes oxide, nitride, oxynitride, oxide-nitride bi-layer (ON), oxide-nitride-oxide multi-layer (ONO) or the combination thereof. For example, semiconductor substrate 310 comprises silicon germanium compounds, strained silicon, single crystal silicon, semiconductor-on-insulator (SOI) and combinations thereof. The surface of the semiconductor substrate 310 may be non-planar.

Next, referring to FIG. 6, a lightly doped region 320 is formed adjacent to the doped source region 316 in the semiconductor layer and closer to the gate electrode 314 than the doped source region 316. The junction of the lightly doped region 320 is formed adjacent to the gate electrode 314. It should be noted that the lightly doped region 320 is formed one side of the source region 316 or a drain region 318. Specifically, it is formed adjacent to the source region 316 as shown in FIG. 6. The p-n junction of the lightly doped region 320 is shallower than the one of the source and drain regions 316, 318. Alternatively, the other choice is introduced the usage of double diffused drain (DDD) structure to reduce the junction breakdown effect. The conductive ion type of the DDD structure is the same as that of the source region. A pocket ion implantation region 322 is optionally formed adjacent to the source region 316 or drain region 318 and adjacent to the gate structure to reduce the short channel effect and increase the efficiency of the hot carrier injection, the p-n junctions of the pocket ion implantation region 322 is formed under the gate electrode 314 and the lightly doped region 320. The conductive type of source region 316 and drain region 318 are opposite to the conductive type of the pocket doped region 322.

Figure 7:
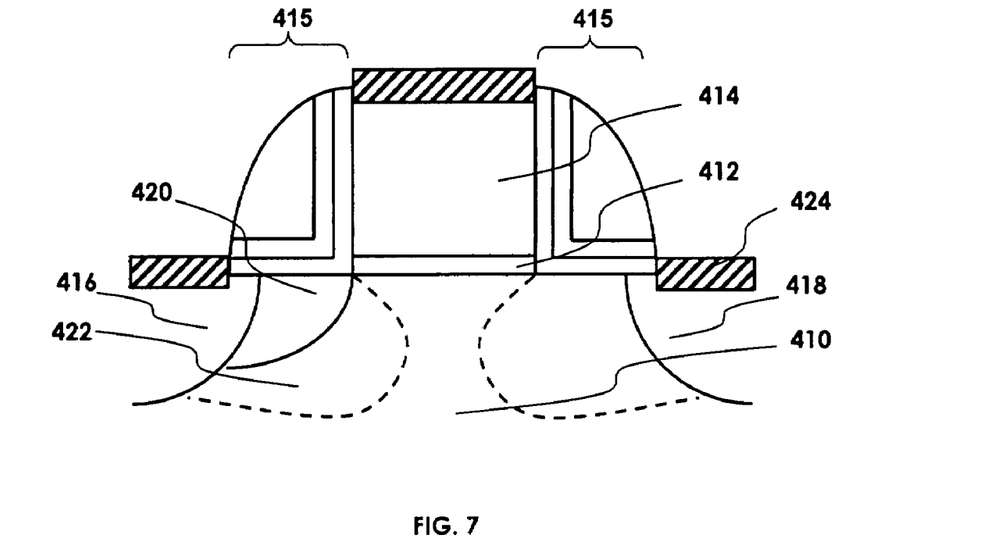
FIG. 7 is a cross sectional view of a semiconductor device illustrating the fourth embodiment according to the present invention.

FIG. 7 illustrates the fourth embodiment of the present invention, wherein the pocket ion implantation region 422 is optionally formed adjacent to the source region 416 and drain region 418 and adjacent to the gate structure to reduce the short channel effect and increase the efficiency of the hot carrier injection. The p-n junctions of the pocket ion implantation region 422 are formed under the gate electrode 414 and the lightly doped region 420. The conductive type of source region 416 and drain region 418 are opposite to the conductive type of the pocket doped region 422.

Similarly, the effective channel length is longer than gate electrode due to the existence of predetermined distance from drain 418 to gate electrode. Such structure creates a relatively low coupling capacitance than prior arts. Of course, it should produce a faster programming speed than the prior arts.

Figure 8:
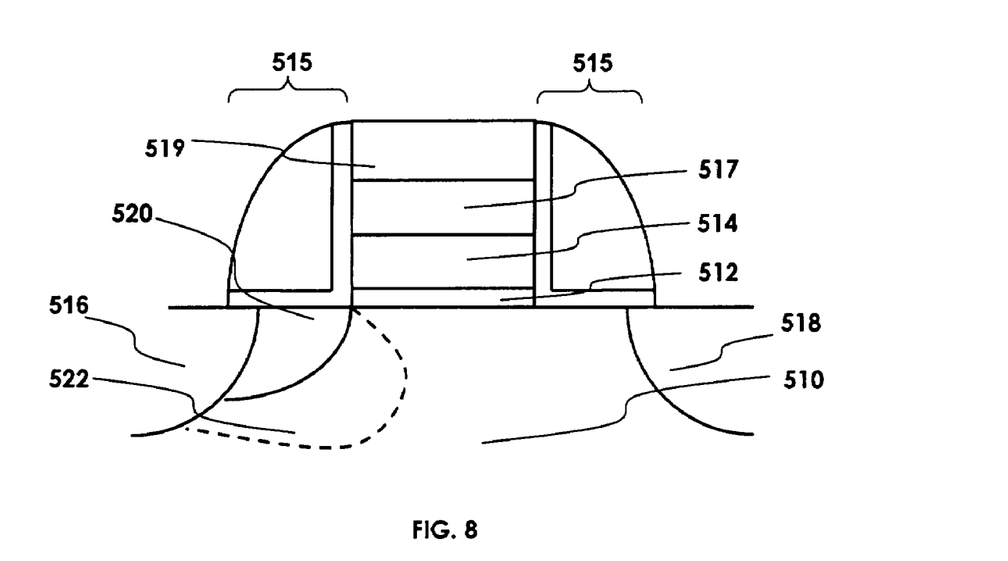
FIG. 8 is a cross sectional view of a semiconductor device illustrating the fifth embodiment according to the present invention.

FIG. 8 illustrates the fifth embodiment of the present invention, wherein a lightly doped region 520 is formed adjacent to the doped source region 516 in the semiconductor layer and closer to a gate structure including a dielectric layer 512 and gate conductive multi-layers 514, 517 and 519 than the doped drain region 518. For example, materials of the gate conductive multi-layers 514, 517 and 519 comprise with polysilicon, WSix and isolating dielectric material, respectively. The junction of the lightly doped region 520 is formed adjacent to the gate structure. The lightly doped region 520 can be formed one side of the source region 516 or a drain region 518. Specifically, it is formed adjacent to the source region 516 as shown in FIG. 8. The p-n junction of the lightly doped region 520 is shallower than the source and drain regions 516, 518. Alternatively, the other choice is introduced the usage of double diffused drain (DDD) structure to reduce the junction breakdown effect. The conductive type of the DDD structure is the same as the source region. Moreover, the pocket ion implantation region 522 is optionally formed to reduce the short channel effect and increase the efficiency of the hot carrier injection, shown in FIG. 8. The junctions of the pocket implantation region 522 are formed under the gate electrode 514 and the lightly doped region 520. The conductive type of the pocket implant is opposite to the source region 516 and drain region 518.

Similarly, a predetermined distance from drain region 518 to gate electrode is no less than the distance of source region 516 to gate electrode 514. Accordingly, the effective channel length is longer than the gate electrode due to the existence of predetermined distance. Such structure creates a relatively low coupling capacitance than prior arts. Of course, it should produce a faster programming speed than the prior arts.

Figure 9:
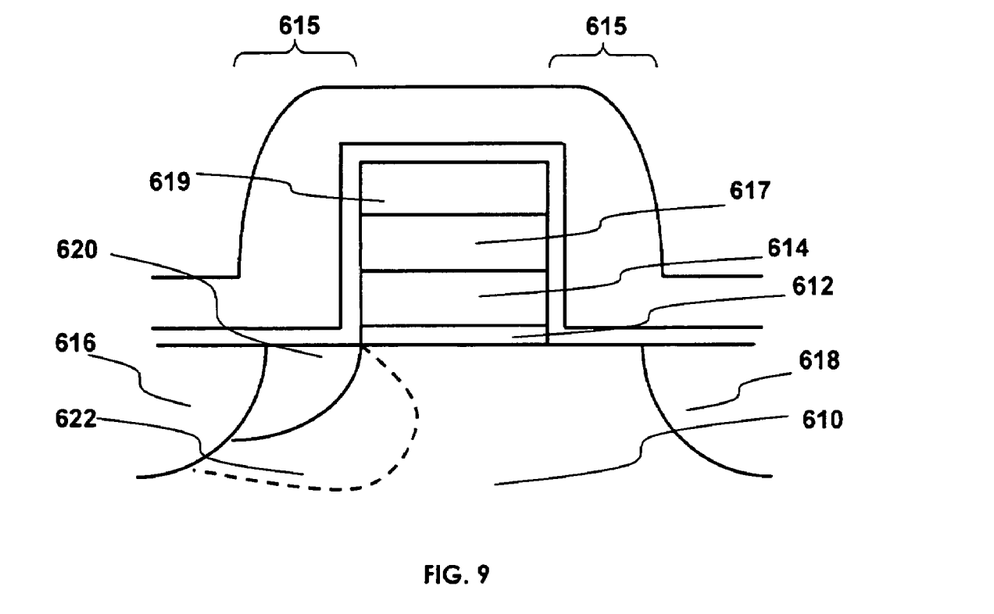
FIG. 9 is a cross sectional view of a semiconductor device illustrating the sixth embodiment according to the present invention.

FIG. 9 illustrates the sixth embodiment of the present invention, wherein a lightly doped region 620 is formed adjacent to the doped source region 616 in the semiconductor layer and closer to a gate structure including a dielectric layer 612 and gate conductive multi-layers 614, 617 and 619 than the doped drain region 618. For example, materials of the gate conductive multi-layers 614, 617 and 619 comprise with polysilicon, WSix and isolating dielectric material, respectively. The junction of the lightly doped region 620 is formed adjacent to the gate structure. The lightly doped region 620 can be formed one side of the source region 616 or a drain region 618. Specifically, it is formed adjacent to the source region 616 as shown in FIG. 9. The p-n junction of the lightly doped region 620 is shallower than the source and drain regions 616, 618. Alternatively, the other choice is introduced the usage of double diffused drain (DDD) structure to reduce the junction breakdown effect. The conductive type of the DDD structure is the same as the source region. Next, the pocket ion implantation region 622 is optionally formed to reduce the short channel effect and increase the efficiency of the hot carrier injection, shown in FIG. 9. The junctions of the pocket implantation region 622 are formed under the gate electrode 614 and the lightly doped region 620. The conductive type of the pocket implant is opposite to the source region 616 and drain region 618. Moreover, a cap layer 615 is optionally covered over the gate structure and the source and drain regions 616, 618. Typically, the cap layer 615 includes ONO (oxide-nitride-oxide) or ON (oxide-nitride).

Figure 10:
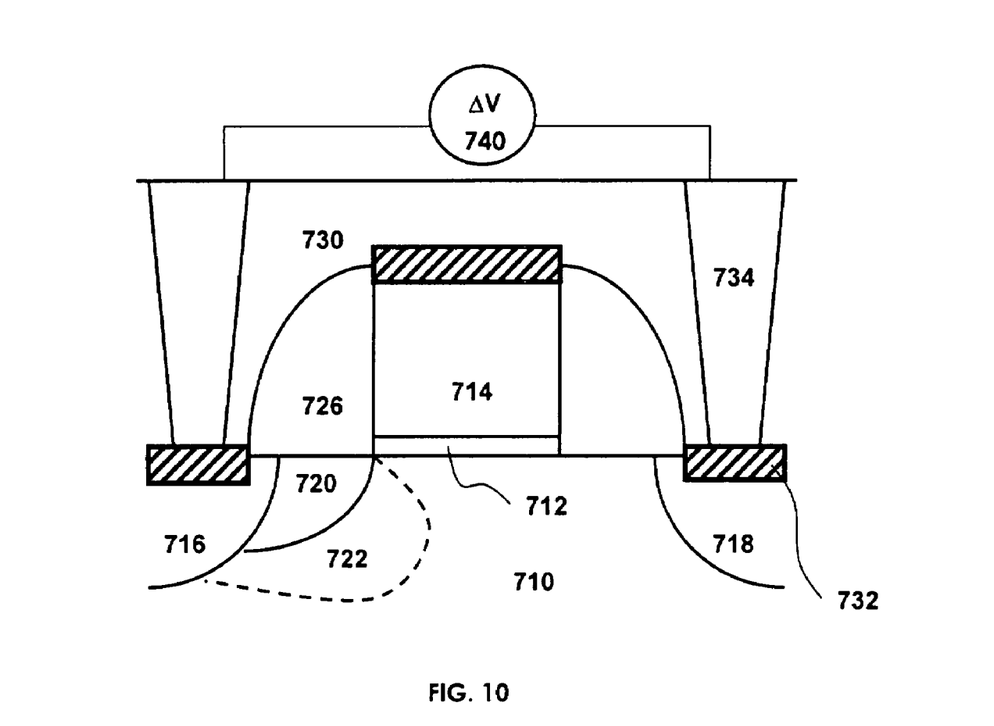
FIG. 10 is a cross sectional view of a semiconductor device illustrating the seventh embodiment according to the present invention.

FIG. 10 illustrates the seventh embodiment of the present invention. Most of the parts are similar to the basic structure of aforesaid first embodiment. By slightly changing the bias of the nodes, we may transfer the basic device into various devices, for instance, anti-fuse. From FIG. 10, an electrical bias having a voltage difference (delta V) 740 is provided between the source region 716 and drain region 718. The voltage or current supply circuit is applied to alter the resistance (R) and the conductivity between the source and drain 716, 718 as digital state "1" or digital state "0" while original channel resistance represents state "0". The semiconductor substrate layer 710 is optionally grounded. In the embodiment, the circuit provides same potential to the gate electrode 714 and the semiconductor substrate layer 710. Under the configuration, the basic structure could be used as an anti-fuse. Moreover, dielectric spacers 726 are optional formed onto the sidewalls of a gate dielectric 712 and the gate electrode 714 and on the semiconductor substrate 710. The dielectric spacers 726 comprise oxide, nitride, oxide-nitride bi-layer, oxide-nitride-oxide multi-layer or the combination of the above materials. Silicide or metal-semiconductor compound 732 is introduced on the exposed surface of the top portion of the gate conductive layer 714 and the source and drain regions 716, 718 to reduce the resistance. Besides, an isolation layer 730 is formed between the gate electrode and a conductive plug 734 includes $SiO_2$, silicon nitride, oxynitride material with dielectric constant less than 3.5 or the combinations thereof. The isolation layer 730 covers the gate structure 714 and spacers 726 then expose silicide or metal-semiconductor compound 732 to isolate the conductive layers from each other. The conductive plug, for example tungsten (W) plug, 734 is formed onto the silicide or metal-semiconductor compound 732 as via connection. The conductive plug 734 includes Al, W, polysilicon, silicide, Cu, Ta, metal-nitride compound or combinations thereof.

Figure 11:
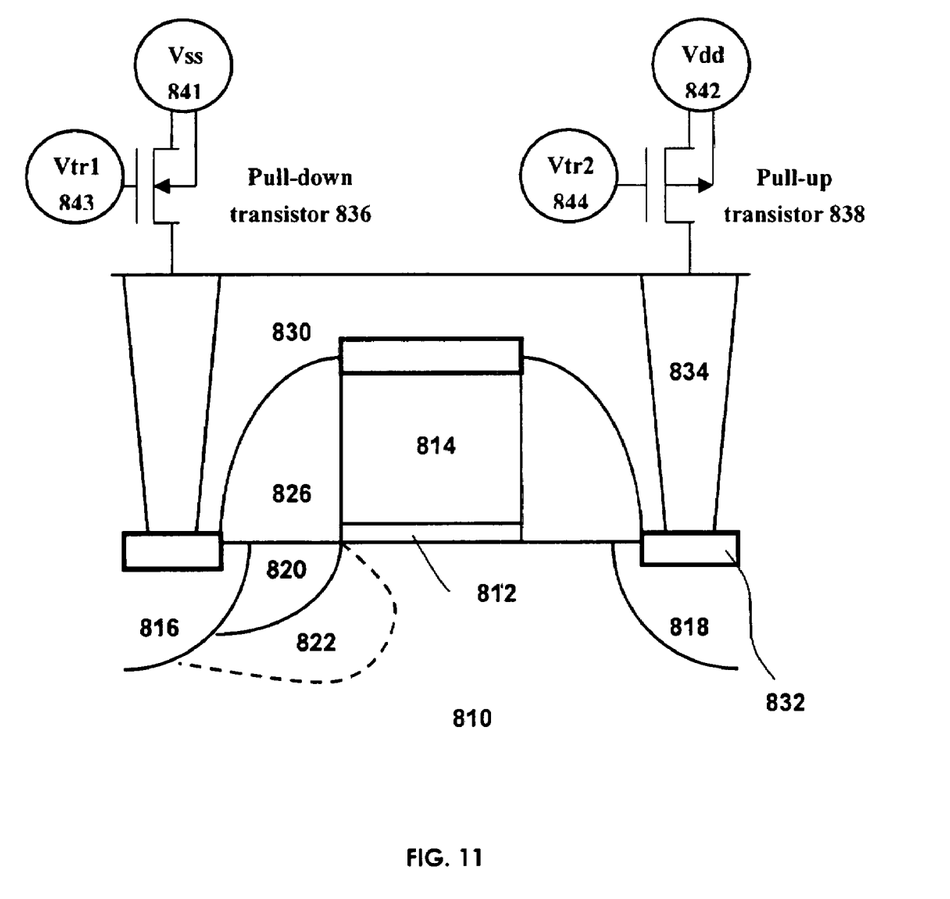
FIG. 11 is a cross sectional view of a semiconductor device illustrating the eighth embodiment according to the present invention.

FIG. 11 illustrates the eighth embodiment of the present invention. Most of the parts (810~834) are similar to the basic structure of aforesaid embodiment. The device further comprises at least one transistor connected to the first or second doped region for circuit switching, voltage pulling-up or voltage pulling-down. The voltage pull-up transistor 838 is a p-channel metal-oxide-semiconductor field effect transistor (pMOSFET) and the pull-down transistor 836 is a n-channel metal-oxide-semiconductor field effect transistor (nMOSFET). By electrically connecting these transistors to nodes in aforesaid first embodiment, we may also transfer the basic device into various anti-fuse devices. From FIG. 11, a nMOSFET as a switch or a voltage pull-down transistor has been provided between a low voltage Vss 841 and the source region. A trigger signal Vtr1 843 is used to turn on this nMOSFET. Another pMOSFET as a switch or a voltage pull-up transistor has been provided between a high voltage Vdd 842 and the drain region. A trigger signal Vtr2 844 is used to turn on this pMOSFET. These voltages or current supplies can be applied to alter the resistance (R) and the conductivity between the source and drain 816, 818 as digital state "1" or digital state "0" while original channel resistance represents state "0". A plurality of nMOSFETs or pMOSFETs or combination of them can also be simultaneously connected to the first or second doped region or substrate as voltage and signal switches.

From the preferred embodiment, the basic device structure could be transferred into other device by slightly changing the bias, spacers scheme or doped region.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. An anti-fuse, comprising:
   a semiconductor substrate;
   a gate dielectric layer formed on said semiconductor substrate;
   a gate electrode formed on said gate dielectric layer;
   a first doped region formed in said semiconductor substrate;

a second doped region formed from a predetermined distance to said gate electrode, wherein said predetermined distance is larger than the distance between said first doped region and gate electrode and the coupling capacitance formed between said second doped region and said gate electrode is less than the coupling capacitance formed between said first doped region and said gate electrode;

a metal-semiconductor compound formed on at least one of said gate electrode and said first and second doped regions;

a conductive plug formed onto said metal-semiconductor compound;

an isolation layer formed between said gate electrode and said conductive plug; and a resistance formed between said first and second doped regions wherein said resistance can be alternated by a predetermined electric signal.

2. The anti-fuse of claim 1, further comprising a channel located under said gate electrode wherein the length of said channel is longer than the length of said gate electrode.

3. The anti-fuse of claim 1, further comprising a third doped region formed adjacent to said first doped region in said semiconductor substrate and between said first doped region and said second doped region.

4. The anti-fuse of claim 3, further comprising pocket doped region formed adjacent to at least one of said first and third doped region, wherein the conductive type of said first and second doped regions are opposite to the conductive type of said pocket doped region.

5. The anti-fuse of claim 3, wherein the junction between said third doped region and said semiconductor substrate is formed under said gate electrode, wherein the junction depth of said third doped region is shallower than the junction depth of said first doped region and the conductive type of said first and third doped regions are the same.

6. The anti-fuse of claim 1, further comprising a fourth doped region formed adjacent to said second doped region wherein the junction depth of said fourth doped region is deeper than the junction depth of said second doped region and the conductive types of said second and fourth doped regions are the same.

7. The anti-fuse of claim 1, wherein said metal-semiconductor compound includes $TiSi_2$, $CoSi_2$ or NiSi.

8. The anti-fuse of claim 1, wherein said semiconductor substrate comprises silicon germanium compounds, strained silicon, polycrystalline silicon, single crystal silicon and combinations thereof.

9. The anti-fuse of claim 1, wherein the surface of said semiconductor substrate is non-planar.

10. The anti-fuse of claim 1, wherein said semiconductor substrate comprises semiconductor-on-insulator (SOI).

11. The anti-fuse of claim 1, wherein said conductive plug includes Al, W, polycrystalline silicon, silicide, Cu, Ta, metal-nitride compound or combinations thereof.

12. The anti-fuse of claim 1, wherein said isolation layer includes $SiO_2$, silicon nitride, oxynitride, dielectric materials with dielectric constant less than 3.5 or combinations thereof.

13. The anti-fuse of claim 1, further comprising a circuit providing an electrical signal between said first and second doped region to alter said resistance, wherein said semiconductor substrate is grounded or biased at the lowest potential output of said circuit.

14. The anti-fuse of claim 13, wherein said circuit further providing same potential to said gate electrode and said semiconductor substrate.

15. An anti-fuse, comprising:
a semiconductor substrate:
a gate dielectric layer formed on said semiconductor substrate;
a gate electrode formed on said gate dielectric layer;
a first doped region formed in said semiconductor substrate;
a dielectric spacer formed onto the sidewall of said gate electrode and part of said semiconductor substrate;
a second doped region formed from a predetermined distance to said gate electrode wherein said predetermined distance is larger than the distance between said first doped region and said gate electrode and the coupling capacitance formed between said second doped region and said gate electrode is less than the coupling capacitance formed between said first doped region and said gate electrode;
a metal-semiconductor compound formed on at least one of said gate electrode and said first and second doped regions;
a conductive plug formed onto said metal-semiconductor compound;
an isolation layer formed between said gate electrode and said conductive plug; and
a resistance formed between said first and second doped regions wherein said resistance can be alternated by a predetermined electric signal.

16. The anti-fuse of claim 15, further comprising pocket doped region formed adjacent to said first or second doped region, and under said gate electrode and said third doped region wherein the conductive type of said first and second doped regions are opposite to the conductive type of said pocket doped region.

17. The anti-fuse of claim 15, further comprising a third doped region formed adjacent to said first doped region in said semiconductor substrate and between said first doped region and second doped region.

18. The anti-fuse of claim 17, wherein the junction between said third doped region and semiconductor substrate is formed under said gate electrode, wherein the junction depth of said third doped region is shallower than the junction depth of said first doped region and the conductive type of said first and third doped regions are the same.

19. The anti-fuse of claim 15, further comprising a fourth doped region formed adjacent to said second doped region wherein the junction depth of said fourth doped region is deeper than the junction depth of said second doped region and the conductive types of said second and fourth doped regions are the same.

20. The anti-fuse of claim 15, wherein said metal-semiconductor compound includes $TiSi_2$, $CoSi_2$ or NiSi.

21. The anti-fuse of claim 15, wherein said dielectric spacer includes oxide, nitride, oxynitride, oxide-nitride bi-layer, oxide-nitride-oxide multi-layer or the combination thereof.

22. The anti-fuse of claim 15, wherein said semiconductor substrate comprises silicon germanium compounds, strained silicon, polycrystalline silicon, single crystal silicon and combinations thereof.

23. The anti-fuse of claim 15, wherein the surface of said semiconductor substrate is non-planar.

24. The anti-fuse of claim 15, wherein said semiconductor substrate comprises semiconductor-on-insulator (SOI).

25. The anti-fuse of claim 15, wherein said conductive plug includes Al, W, polycrystalline silicon, silicide, Cu, Ta, metal-nitride compound or combinations thereof.

26. The anti-fuse of claim 15, wherein said isolation layer includes SiO$_2$, silicon nitride, oxynitride, dielectric materials with dielectric constant less than 3.5 or combinations thereof.

27. The anti-fuse of claim 15, further comprising a circuit providing an electrical signal between said first and second doped regions to alter said resistance, wherein said semiconductor substrate is grounded or biased at the lowest potential output of said circuit.

28. The anti-fuse of claim 27, wherein said circuit further providing same potential to said gate electrode and said semiconductor substrate.

29. The anti-fuse of claim 15, further comprising a channel located under said gate electrode wherein the length of said channel is longer than the length of said gate electrode.

30. The anti-fuse of claim 15, further comprising at least one transistor connected to said first or second doped region for circuit switching, voltage pulling-up or voltage pulling-down.

31. The anti-fuse of claim 30, wherein said transistor is a metal-oxide-semiconductor field effect transistor.

* * * * *